US007741705B2

(12) United States Patent
Watanabe

(10) Patent No.: US 7,741,705 B2
(45) Date of Patent: Jun. 22, 2010

(54) SEMICONDUCTOR DEVICE AND METHOD OF PRODUCING THE SAME

(75) Inventor: Kiyonori Watanabe, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/889,830

(22) Filed: Aug. 16, 2007

(65) Prior Publication Data

US 2008/0054479 A1    Mar. 6, 2008

(30) Foreign Application Priority Data

Aug. 29, 2006    (JP) .............................. 2006-232233

(51) Int. Cl.
*H01L 23/495* (2006.01)
(52) U.S. Cl. .............................. 257/673; 257/E23.023; 438/613
(58) Field of Classification Search ......... 438/612–615; 257/673, E23.021, E23.023, E23.067
See application file for complete search history.

(56) References Cited

U.S. PATENT DOCUMENTS

| 6,835,595 B1 * | 12/2004 | Suzuki et al. ................ 438/107 |
| 7,253,519 B2 * | 8/2007 | Huang et al. ................. 257/738 |
| 2004/0150104 A1 * | 8/2004 | Terui ........................... 257/734 |

FOREIGN PATENT DOCUMENTS

| JP | 06-84886 | 3/1994 |
| JP | 2000-22217 | 1/2000 |
| JP | 2003-060120 | 2/2003 |

* cited by examiner

*Primary Examiner*—David Vu
(74) *Attorney, Agent, or Firm*—Kubotera & Associates LLC

(57) ABSTRACT

A semiconductor device includes a semiconductor substrate having an internal circuit; an electrode pad electrically connected to the internal circuit; an insulating film having a through hole exposing the electrode pad; and a re-distribution wiring pattern formed on the insulating film and electrically connected to the electrode pad. The semiconductor device further includes a recess groove formed in the insulating film around and adjacent to the re-distribution wiring pattern.

6 Claims, 8 Drawing Sheets

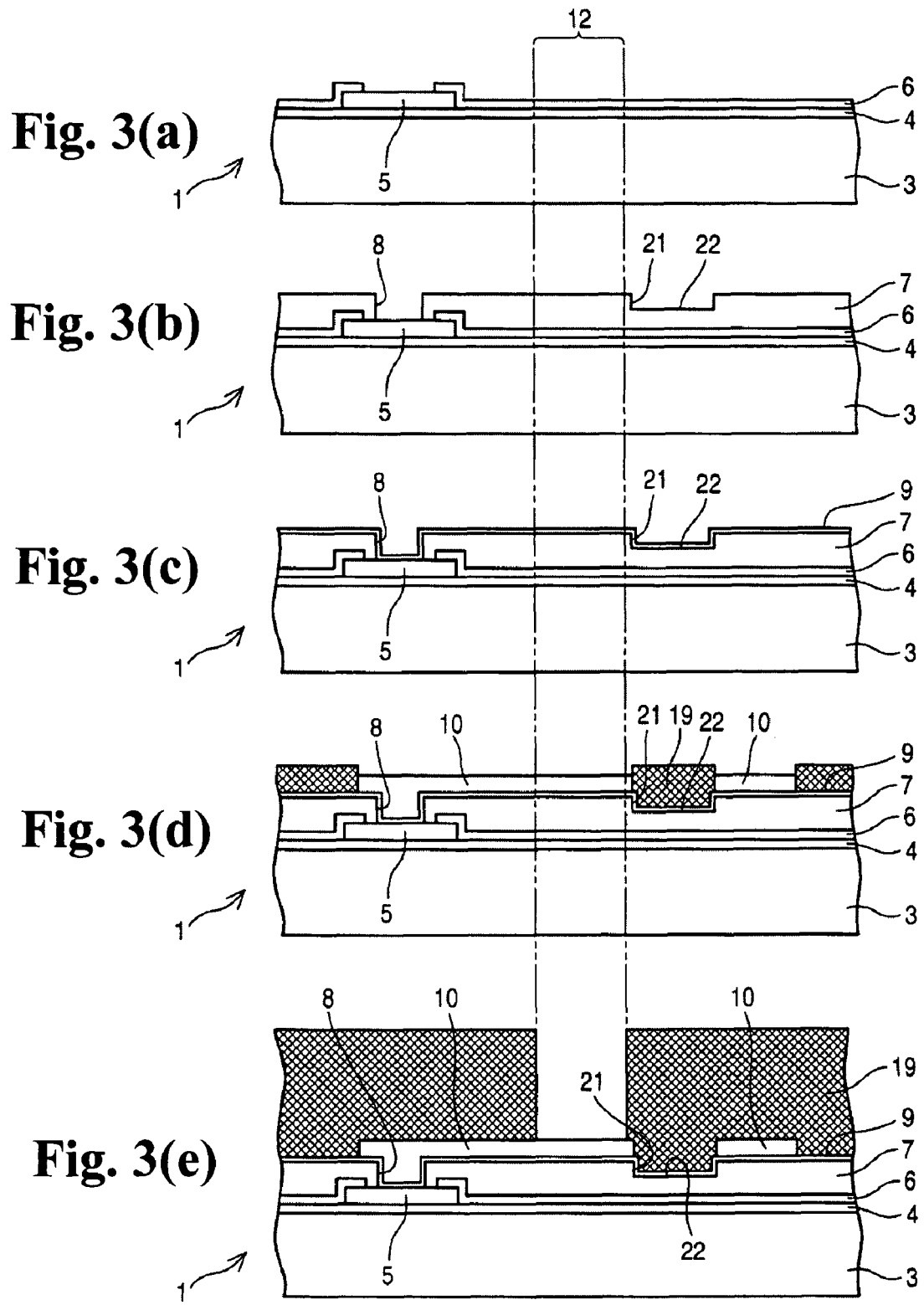

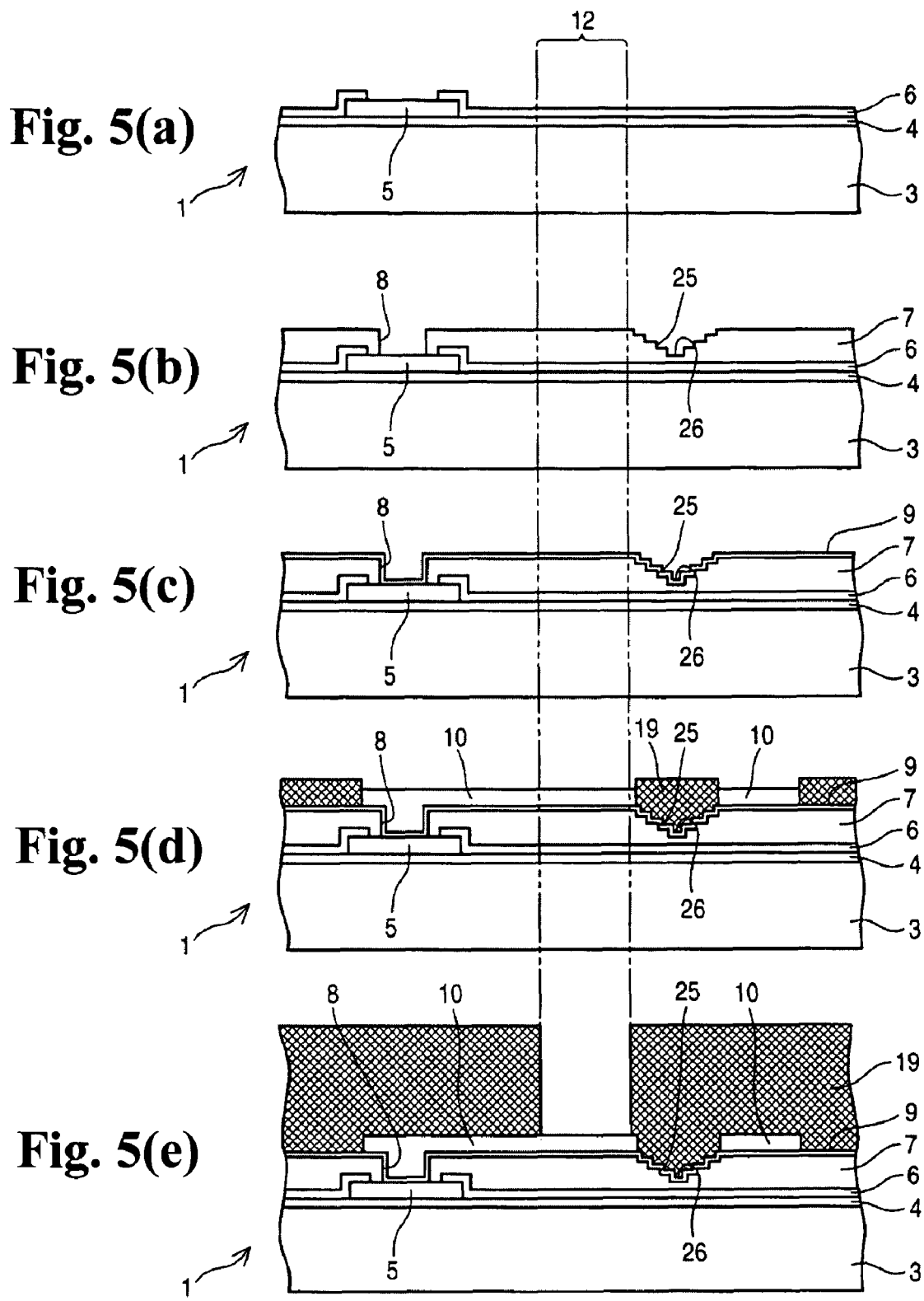

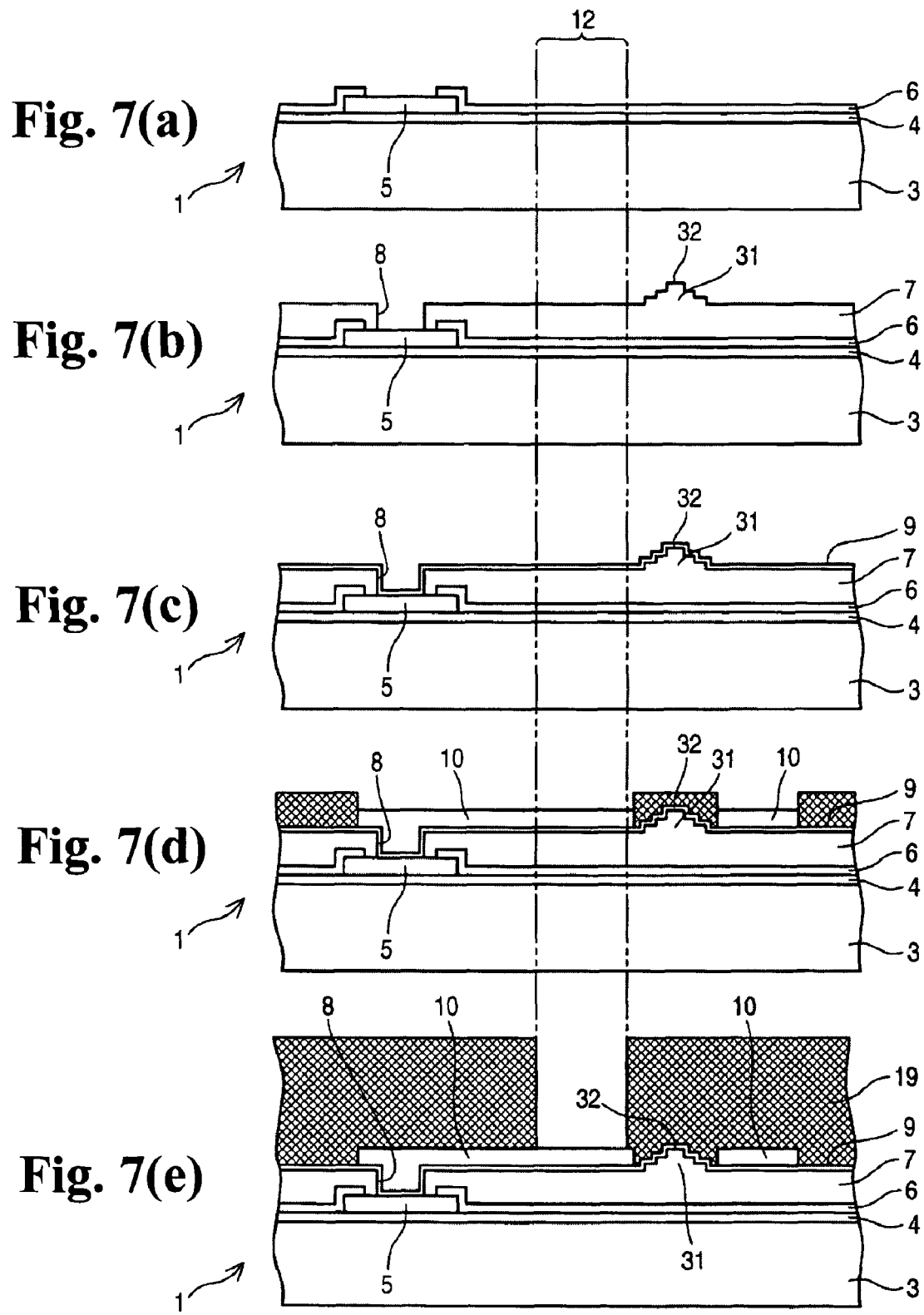

SEMICONDUCTOR DEVICE AND METHOD OF PRODUCING THE SAME

BACKGROUND OF THE INVENTION AND RELATED ART STATEMENT

The present invention relates to a semiconductor device and a method of producing the semiconductor device. In particular, the present invention relates to a semiconductor device including a wafer level Chip Size Package (CSP), in which a semiconductor wafer is divided into pieces to obtain the semiconductor device.

Recently, it has been required to reduce a size or a thickness of a semiconductor device having an internal circuit formed of a plurality of integrated semiconductor elements. Especially when it is necessary to reduce a thickness of a semiconductor device, a semiconductor device of a CSP type has become one of mainstream technologies, in which bump electrodes with a spherical shape are arranged in a matrix pattern for electrically connecting to an internal circuit of the semiconductor device.

In the semiconductor device of the CSP type, the bump electrodes with a spherical shape are arranged in a matrix pattern, and a re-distribution wiring pattern is provided for connecting the bump electrodes to electrode pads electrically connected to specific positions of the internal circuit, so that the bump electrodes are arranged in a pattern shifted relative to the electrode pads. When it is necessary to reduce a size of the semiconductor device, it is necessary to reduce a size of the re-distribution wiring patterns, i.e., reduce a distance between wiring patterns in the re-distribution wiring patterns.

In a conventional semiconductor device of the CSP type, an internal circuit is formed on a front surface of a semiconductor substrate or a semiconductor wafer, and an electrode pad is formed on an insulating film formed on the internal circuit for electrically connecting to the internal circuit. A surface protection layer is formed on the electrode pad and the insulating film, and the surface protection layer on the electrode pad is removed through etching. Then, an insulating film formed of a polyimide is formed on the surface protection layer, and the insulating film is etched to form a through hole reaching the electrode pad.

In the next step, a base metal layer is formed on the electrode pad and the insulating film through a sputtering method, and a resist mask is formed through photolithography. With the resist mask, a re-distribution wiring pattern formed of copper (Cu) is formed on the base metal layer through a metal plating method, so that the re-distribution wiring pattern with a thickness of about 5 µm extends from the electrode pad to a forming area of a post electrode.

In the next step, the post electrode formed of copper is formed through a metal plating method, so that the post electrode has a size of about 100 µm. Then, the semiconductor wafer is placed in a sealing mold, and a sealing resin such as an epoxy resin is injected over a whole surface of the semiconductor substrate where the circuits are disposed, thereby forming a sealing layer. Then, a post end surface of the post electrode is exposed from a front surface, so that a bump electrode with a semi-spherical shape is formed on the post end surface. At last, the semiconductor wafer is divided into a plurality of pieces to obtain a semiconductor device (refer to Patent Reference 1).

In another conventional semiconductor device, a semiconductor element such as a bipolar transistor is formed on a semiconductor substrate, and a groove with a V character shape is formed around the semiconductor element. Accordingly, it is possible to increase a distance through which water enters from a boundary between a polyimide resin film covering the semiconductor element and the semiconductor substrate, thereby prolonging moisture resistant life of the semiconductor device (refer to Patent Reference 2).

In a further conventional semiconductor device, a stem is provided for mounting a semiconductor device such as an optical semiconductor element. A groove with a concave shape or a convex shape is formed in the stem to surround the semiconductor device. Accordingly, it is possible to increase a distance through which water enters from a boundary between a sealing resin and the stem, thereby improving moisture resistant and reliability of a semiconductor package, in which the semiconductor device is sealed with the sealing resin (refer to Patent Reference 3).

Patent Reference 1: Japanese Patent Publication No. 2003-60120

Patent Reference 2: Japanese Patent Publication No. 06-84886

Patent Reference 3: Japanese Patent Publication No. 2000-22217

In the conventional semiconductor device described in Patent Reference 1, the re-distribution wiring pattern is formed on the insulating film, and the sealing layer seals the re-distribution wiring pattern. In the semiconductor device, when the semiconductor device is placed under a high temperature and high humidity condition, the re-distribution wiring pattern tends to be oxidized and corroded due to moisture absorbed in the insulating film and the sealing layer. Accordingly, a substance (corrosion product substance) created through the corrosion may grow and extend between the insulating film and the sealing layer. As a result, a distance between adjacent wiring patterns decreases, and an electrical leak may occur when the adjacent wiring patterns have different potential, thereby deteriorating reliability of the semiconductor device.

The phenomenon described above becomes more evident when a semiconductor device has a small size and the CSP type structure, in which a distance between wiring patterns is very small.

In the conventional semiconductor device described in Patent Reference 2, the groove is provided around the semiconductor element, so that it is possible to increase a distance through which water enters from the boundary between the polyimide resin film and the semiconductor substrate. Accordingly, it is possible to reduce an influence of water on the semiconductor element. However, it is difficult to prevent an electrical leak due to a corrosion product substance created by moisture absorbed in the polyimide resin film.

In the conventional semiconductor device described in Patent Reference 3, the groove is provided around the semiconductor device. Accordingly, it is possible to increase a distance through which water enters from the boundary between the sealing resin of the semiconductor device package and the stem. However, it is difficult to prevent an electrical leak due to a corrosion product substance created in the re-distribution wiring pattern due to moisture in a sealing layer and an insulating film in the semiconductor device absorbed through the sealing resin.

In view of the problems described above, an object of the present invention is to provide a semiconductor device to solve the problems of the conventional semiconductor device. In particular, in the semiconductor of the invention, it is possible to effectively prevent an electrical leak in a re-distribution wiring pattern due to a corrosion product substance created by moisture absorbed in a the semiconductor device, thereby improving moisture resistance life of the semiconductor device.

Further objects and advantages of the invention will be apparent from the following description of the invention.

SUMMARY OF THE INVENTION

In order to attain the objects described above, according to the present invention, a semiconductor device includes a semiconductor substrate having an internal circuit; an electrode pad electrically connected to the internal circuit; an insulating film having a through hole exposing the electrode pad; and a re-distribution wiring pattern formed on the insulating film and electrically connected to the electrode pad. The semiconductor device further includes a recess groove formed in the insulating film around and adjacent to the re-distribution wiring pattern.

In the semiconductor device in the present invention, even when the re-distribution wiring pattern is corroded due to moisture absorbed in the insulating film or a sealing layer, it is possible to increase a distance in a vertical direction along which a corrosion product substance grows between the insulating film and the sealing layer. Accordingly, it is possible to effectively prevent an electrical leak in the re-distribution wiring pattern, thereby improving moisture resistance life of the semiconductor device.

BRIEF DESCRIPTION OF THE DRAWINGS

FIGS. 3(a) to 3(e) are schematic views showing a process of producing a semiconductor device according to a second embodiment of the present invention;

FIGS. 5(a) to 5(e) are schematic views showing a process of producing a semiconductor device according to a third embodiment of the present invention;

FIGS. 7(a) to 7(e) are schematic views showing a process of producing a semiconductor device according to a fourth embodiment of the present invention.

DETAILED DESCRIPTION OF PREFERRED EMBODIMENTS

Figure 1A:
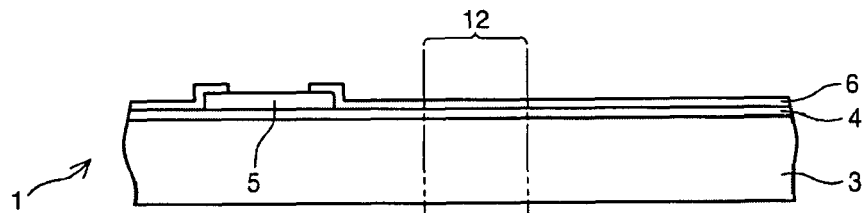
FIGS. 1(a) to 1(e) are schematic views showing a process of producing a semiconductor device according to a first embodiment of the present invention.

Hereunder, embodiments of the present invention will be explained with reference to the accompanying drawings.

First Embodiment

A first embodiment of the present invention will be explained. FIGS. 1(a) to 1(e) are schematic views showing a process of producing a semiconductor device according to the first embodiment of the present invention. FIGS. 2(a) to 2(c) are schematic views showing the process of producing the semiconductor device according to the first embodiment of the present invention. FIGS. 1(a) to 1(e) and 2(a) to 2(c) are partially sectional views showing an electrode pad 5 to be formed in a semiconductor wafer 1; a re-distribution wiring pattern 10 with a post electrode 11 electrically connected to the electrode pad 5; and a surrounding portion of the re-distribution wiring patterns 10. From the semiconductor wafer 1, it is possible to produce a plurality of semiconductor devices concurrently.

In the embodiment, the semiconductor wafer 1 includes a semiconductor substrate 3 formed of silicon (Si). An internal circuit having a plurality of semiconductor elements is formed on a front surface of the semiconductor substrate 3. The front surface of the semiconductor substrate 3 with the internal circuit formed thereon is called a circuit forming surface. An insulating layer 4 is formed on the circuit forming surface of the semiconductor substrate 3 with a chemical vapor deposition (CVD) method and the likes. The insulating layer 4 is formed of an insulating material such as silicon dioxide ($SiO_2$). A contact hole (not shown) is formed in the insulating layer 4 at a specific position of the internal circuit of the semiconductor substrate 3.

In the embodiment, the electrode pad 5 is formed on the insulating layer 4. A conductive layer formed of a conductive material such as aluminum (Al) and aluminum containing silicon is etched in a specific shape with a sputtering method and the likes to form the electrode pad 5. The electrode pad 5 is electrically connected to a specific portion of the internal circuit through a conductive member embedded in the contact hole of the insulating layer 4. A surface protection film 6 formed of an insulating material such as silicon nitride ($Si_3N_4$) and the likes is formed with the CVD method and the likes for covering the insulating layer 4 and an edge portion of the electrode pad 5.

In the embodiment, an insulating film 7 having a thickness of 5 μm to 10 μm is formed on the surface protection film 6. In forming the insulating film 7, an insulating resin material with positive-type or negative-type photosensitivity such as a polyimide is coated on the surface protection film 6. Then, after the insulating resin material is processed through an exposing step and a developing process to form a through hole 8 and the likes, the insulating resin material is cured through a thermal process to form the insulating film 7. The through hole 8 penetrates through the insulating film 7 and reaches the electrode pad 5, so that the electrode pad 5 is exposed at a bottom thereof.

In the embodiment, a base metal layer 9 is formed on a whole surface on the circuit forming surface of the semiconductor substrate 3 of the semiconductor wafer 1 for covering the insulating film 7, an inner surface of the through hole 8, and the electrode pad 5 exposed at the bottom of the through hole 8. The base metal layer 9 is formed of laminated metal thin layers formed of a conductive material such as titanium (Ti), titanium nitride (TiN), and copper (Cu).

In the embodiment, the re-distribution wiring patterns 10 are formed on the base metal layer 9. When the re-distribution wiring patterns 10 are formed, first, a mask is formed over an area except an area from the electrode pad 5 in the base metal layer 9 to an electrode forming area 12 where the post electrode 11 connected to the electrode pad 5 is formed with photolithography and the likes. Further, the mask is formed over an area between the electrode pads 5. Then, a conductive material such as copper is electrically deposited on an exposed area of the base metal layer 9 with an electro plating method using a copper sulfate solution, in which a voltage of about 0.5 V is applied between a plating electrode and the base metal layer 9 as a common negative electrode for 17 to 20 minutes. Accordingly, the re-distribution wiring patterns 10 are formed as wiring patterns on the insulating film 7 through the base metal layer 9.

In the embodiment, the through hole 8 is filled with a conductive material, so that the re-distribution wiring pattern 10 is electrically connected to the electrode pad 5 through the base metal layer 9. Accordingly, with the re-distribution wiring patterns 10, the electrode pad 5 is electrically connected to the post electrode 11, or the electrode pads 5 are electrically connected with each other.

In the embodiment, a mask is formed over an area except the electrode forming area 12 of the re-distribution wiring pattern 10 with photolithography and the likes. A specific voltage is applied to an exposed area of the re-distribution wiring pattern 10 for a specific period of time with the base metal layer 9 as a common negative electrode. Then, a material similar to that of the re-distribution wiring patterns 10 is electrically deposited with an electro plating method using a plating solution similar to that in forming the re-distribution wiring patterns 10, so that the post electrode 11 with a column shape is formed.

In the embodiment, a groove portion 14 is formed adjacent to the re-distribution wiring patterns 10 in the insulating film 7 below the base metal layer 9. When the post electrode 11 is formed with the electro plating method, a relatively high voltage (double of a normal voltage in the embodiment) is applied between the base metal layer 9 and a plating electrode to form the groove portion 14 having a small width. During the electro plating, a sectional area of the negative electrode rapidly increases due to the re-distribution wiring patterns 10 formed on the base metal layer 9. Accordingly, a current flows in an enlarged portion, or flows out from the enlarged portion, thereby generating a cavity due to electrical field concentration caused in a circumferential edge portion of the re-distribution wiring patterns 10 on the base metal layer 9.

In the embodiment, the groove portion 14 may have a depth reaching the surface protection film 6, and preferably has a depth not reaching the surface protection film 6, i.e., a depth smaller than a film thickness of the insulating film 7. A voltage of higher than 1.0 V is applied for two hours, so that the groove portion 14 having a depth of about 1.0 µm is formed in the insulating film 7 around the re-distribution wiring patterns 10. Note that when the post electrode 11 is formed with a normal electro plating method, a voltage of about 0.5 V is applied for two hours.

In the embodiment, a sealing layer 16 is formed on the insulating film 7 on the front surface of the semiconductor substrate 3 of the semiconductor wafer 1 for covering the base metal layer 9, the re-distribution wiring patterns 10, and a side surface of the post electrode 11, except a post end surface of the post electrode 11 to be exposed. In forming the sealing layer 16, a sealing resin such as an epoxy resin is coated or injected on the circuit forming surface of the semiconductor substrate 3 of the semiconductor wafer 1, and the sealing resin is cured with heat.

In the embodiment, a bump electrode 17 is formed on the post end surface of the post electrode 11. The bump electrode 17 has a semi-spherical shape, and is formed of solder with a solder ball method, a screen printing method, and the likes. The bump electrode 17 is connected to a wiring pattern end of a mounting substrate (not shown), and functions as an external terminal of the semiconductor device. Accordingly, the internal circuit formed in the semiconductor substrate 3 is connected to an external device through the electrode pad 5, the base metal layer 9, the re-distribution wiring pattern 10, the post electrode 11, and the bump electrode 17.

In the embodiment, a resist mask 19 is formed on the base metal layer 9 and the re-distribution wiring patterns 10 with photolithography. A resist material with positive-type or negative-type photosensitivity is coated on the circuit forming surface of the semiconductor substrate 3 of the semiconductor wafer 1, and the resist material is exposed and developed to form the resist mast 19.

A method of producing the semiconductor device will be explained next with reference to FIGS. 1(a) to 1(e) and 2(a) to 2(c).

Figure 2A:
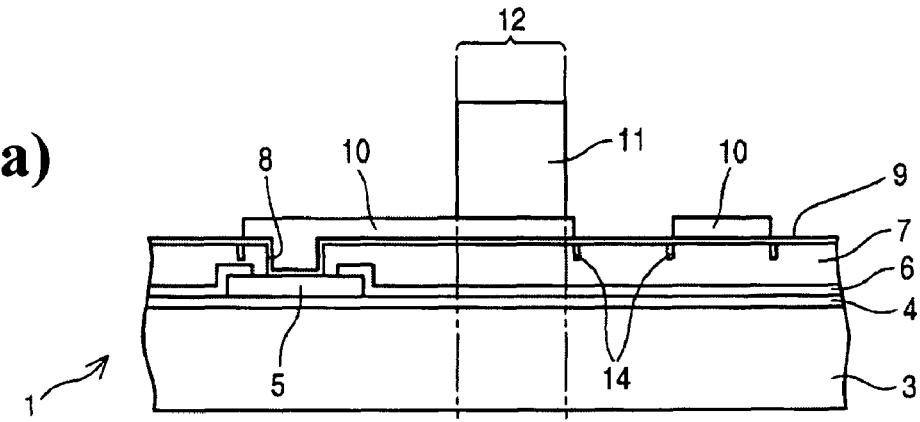
FIGS. 2(a) to 2(c) are schematic views showing the process of producing the semiconductor device according to the first embodiment of the present invention.
Figure 2B:
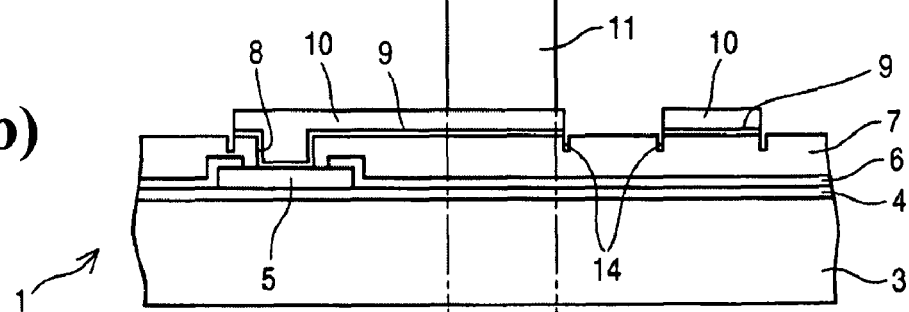
Figure 2C:
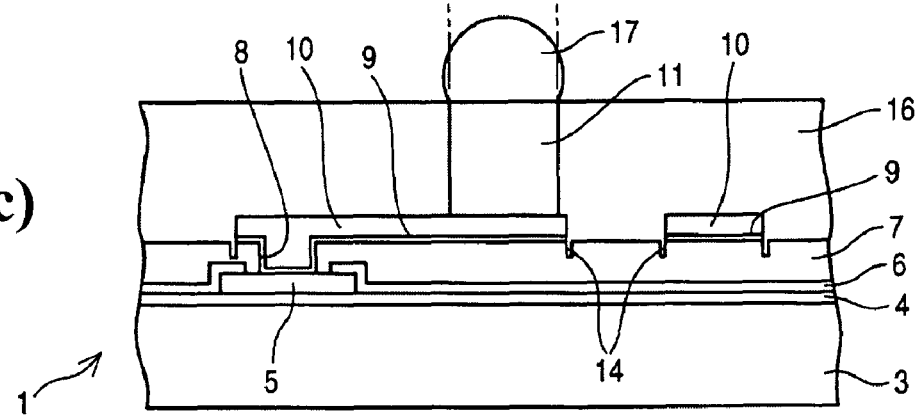

First, as shown in FIG. 1(a), the internal circuit having a plurality of semiconductor elements is formed on the circuit forming surface of the semiconductor substrate 3 of the semiconductor wafer 1. After the insulating layer 4 with the contact hole (not shown) opening at a specific position of the internal circuit is formed, the conductive layer formed of aluminum is formed on the insulating layer 4 with the sputtering method, and the conductive layer is etched in a specific shape to form the electrode pad 5 electrically connected to the specific position of the internal circuit. After the electrode pad 5 is formed, the surface protection film 6 formed of silicon nitride is formed on the electrode pad 5 and the insulating layer 4 with the CVD method. Then, the surface protection film 6 on the electrode pad 5 is etched, so that the electrode pad 5 is exposed.

Figure 1B:
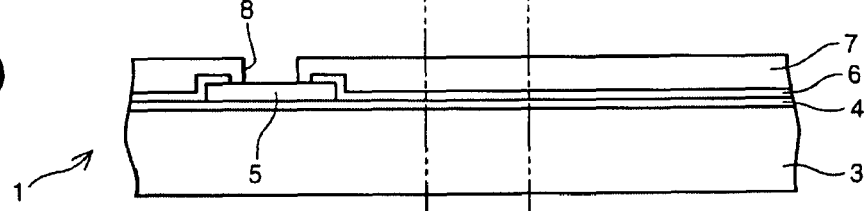

In the next step, as shown in FIG. 1(b), the insulating resin material formed of polyimide with negative-type photosensitivity is coated on the surface protection film 6 and the electrode pad 5 thus exposed. With the photo mask blocking the forming area of the through hole 8 on the electrode pad 5, an exposure device (not shown) irradiates ultraviolet light on the insulating resin material, so that the insulating resin material in a surrounding area of the forming area of the through hole 8 is cured up to a specific thickness of the insulating film 7. Afterward, the insulating resin material in an unexposed area is removed through the developing process, and the insulating resin material is cured through the thermal process to form the through hole 8 penetrating through the insulating film 7 to the electrode pad 5.

In this step, when the insulating resin material with positive-type photosensitivity is used, the photo mask blocks an area except the forming area of the through hole 8. Then, the insulating resin material is exposed, so that the insulating resin material in the forming area of the through hole 8 is softened. The insulating resin material in an exposed area is removed through the developing process, and the insulating resin material is cured through the thermal process to form the through hole 8.

Figure 1C:
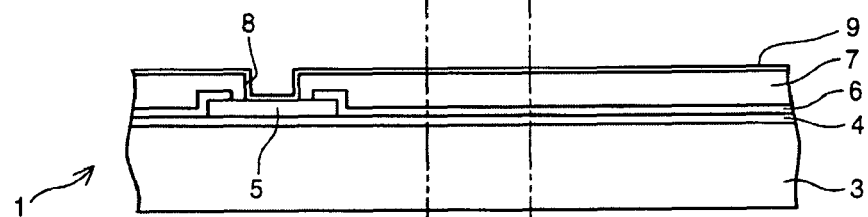

In the next step, as shown in FIG. 1(c), with the sputtering method, the base metal layer 9 is formed on the circuit forming surface of the semiconductor substrate 3 of the semiconductor wafer 1 for covering the insulating film 7, an inner surface of the through hole 8, and the electrode pad 5 exposed at the bottom of the through hole 8.

Figure 1D:
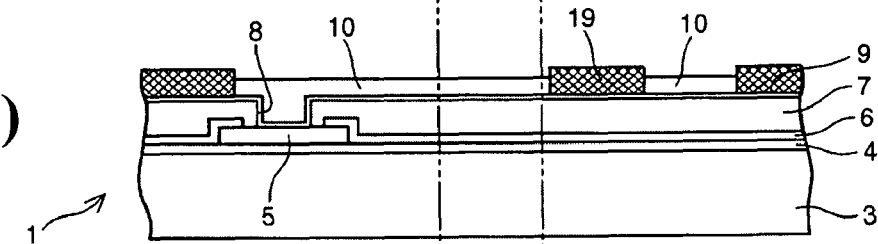

In the next step, as shown in FIG. 1(d), the resist mask 19 is formed with photolithography over the area except the area of the re-distribution wiring pattern 10 from the electrode pad 5 in the base metal layer 9 to the electrode forming area 12 and the area of the re-distribution wiring pattern 10 between the electrode pads 5. Then, copper is electrically deposited on the exposed area of the base metal layer 9 with an electro plating method using the base metal layer 9 as the common negative electrode. Accordingly, the re-distribution wiring patterns 10 are formed from the electrode pad 5 to the electrode forming area 12 and between the electrode pads 5.

Figure 1E:
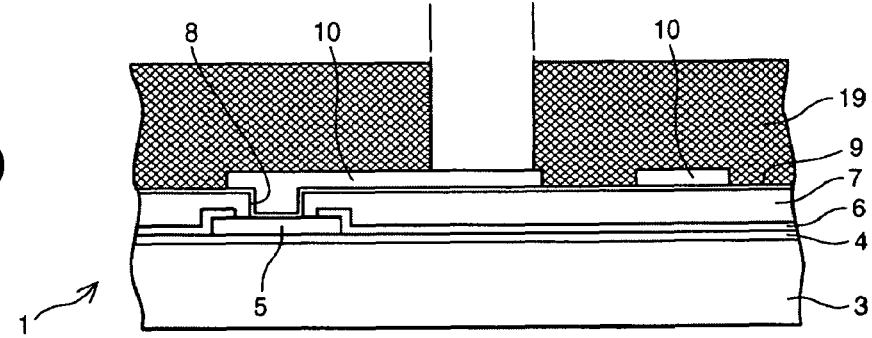

In the next step, as shown in FIG. 1(e), the resist mask 19 formed in the step shown in FIG. 1(d) is removed using a removable solvent. Afterward, the resist mask 19 is formed one more time with the photolithography on the re-distribution wiring patterns 10 in the area except the electrode forming area 12.

In the next step, as shown in FIG. 2(a), the post electrode 11 is formed with the electro plating method using the copper sulfate plating solution and the resist mask 19 formed in FIG. 1(e) as the mask. In the electro plating method, a voltage of 1.0 V is applied to an exposed area of the re-distribution wiring patterns 10 for two hours between the plating electrode and the base metal layer 9 as the common negative electrode, and then copper is deposited to form the post electrode 11. Afterward, the resist mask 19 is removed using a removable solvent.

At this time, due to the electrical field concentration caused in the circumferential edge portion of the re-distribution wiring patterns 10 on the base metal layer 9, the cavity is created in the area adjacent to the re-distribution wiring patterns 10 in the insulating film 7 on the base metal layer 9, thereby forming the groove portion 14 having a small width.

In the next step, as shown in FIG. 2(b), the whole surface on the circuit forming surface of the semiconductor substrate 3 of the semiconductor wafer 1 is etched with a wet etching, so that the base metal layer 9 is removed except the re-distribution wiring patterns 10 and the post electrode 11.

In the next step, as shown in FIG. 2(c), the semiconductor wafer 1 is placed in a sealing mold (not shown). The epoxy resin of a thermosetting type is injected into the sealing mold for covering the whole surface on the circuit forming surface of the semiconductor substrate 3 of the semiconductor wafer 1, i.e., for covering the insulating film 7, the base metal layer 9, the re-distribution wiring patterns 10, and the post electrode 11. After the epoxy resin is cured with heat to form the sealing layer 16, the semiconductor wafer 1 is removed from the sealing mold. Then, a front surface of the sealing layer 16 is ground, so that the post end surface of the post electrode 11 is exposed from the front surface of the sealing layer 16.

In next step, flux is coated on the post end surface exposed from the front surface of the sealing layer 16, and the bump electrode 17 with a semi-spherical shape is formed on the post end surface with the solder ball method. With the method described above, the semiconductor wafer 1 having a plurality of semiconductor devices is formed. After forming the semiconductor wafer 1, the semiconductor wafer 1 is divided into individual pieces, thereby obtaining the semiconductor device.

As described above, in the semiconductor device in the embodiment, the groove portion 14 is formed adjacent to the re-distribution wiring patterns 10 in the insulating film 7 around the re-distribution wiring patterns 10. Accordingly, it is possible to increase a distance in a vertical direction along which a corrosion product substance created at a boundary between the insulating film 7 and the sealing layer 16 grows. As a result, when the semiconductor device is operated under a high temperature and high humidity condition, even if the re-distribution wiring patterns 10 are corroded due to moisture absorbed in the insulating film 7 or the sealing layer 16, it is possible to prevent a distance between adjacent re-distribution wiring patterns from increasing rapidly. Accordingly, it is possible to suppress an electrical leak generated between the adjacent re-distribution wiring patterns, thereby improving moisture resistance life of the semiconductor device.

In particular, the effect described above is beneficial in a semiconductor device of the CSP type having a small size, in which adjacent re-distribution wiring patterns are apart from each other by a small distance. When the through hole 8 is formed, the insulating film 7 is exposed just once. Accordingly, it is possible to form the groove portion 14 just through increasing the voltage without prolonging a plating time in forming the post electrode 11. As a result, it is possible to efficiently produce the semiconductor device with improved moisture resistance life without prolonging a production time of the semiconductor device.

As described above, in the embodiment, the groove portion 14 is formed adjacent to the re-distribution wiring patterns 10 in the insulating film 7 around the re-distribution wiring patterns 10 electrically connected to the electrode pad 5 and extending on the insulating film 7 through the base metal layer 9. Accordingly, it is possible to increase a distance in a vertical direction along which a corrosion product substance created at a boundary between the insulating film 7 and the sealing layer 16 grows. As a result, even when the re-distribution wiring patterns 10 is corroded due to moisture absorbed in the insulating film 7 or the sealing layer 16, it is possible to suppress an electrical leak generated between the adjacent re-distribution wiring patterns, thereby improving moisture resistance life of the semiconductor device.

Second Embodiment

Figure 4A:
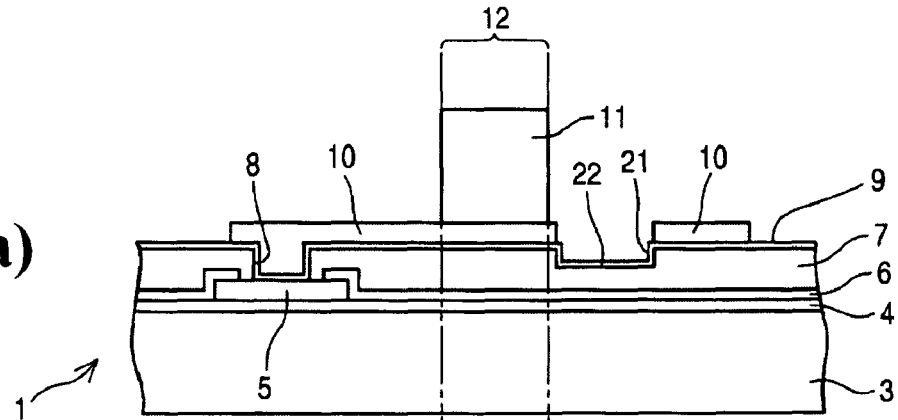
FIGS. 4(a) to 4(c) are schematic views showing the process of producing the semiconductor device according to the second embodiment of the present invention.
Figure 4B:
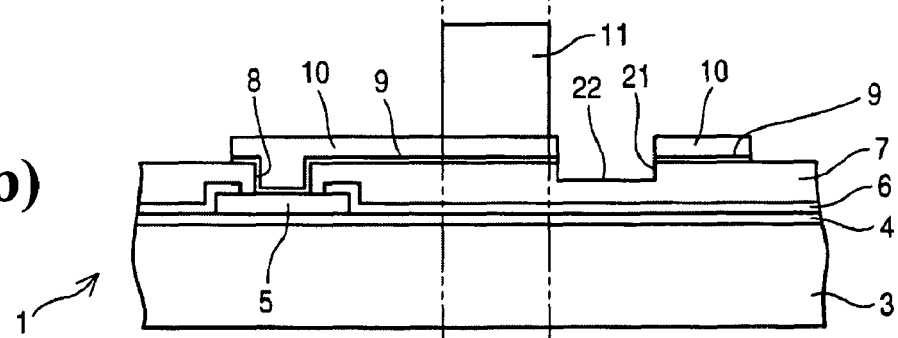
Figure 4C:
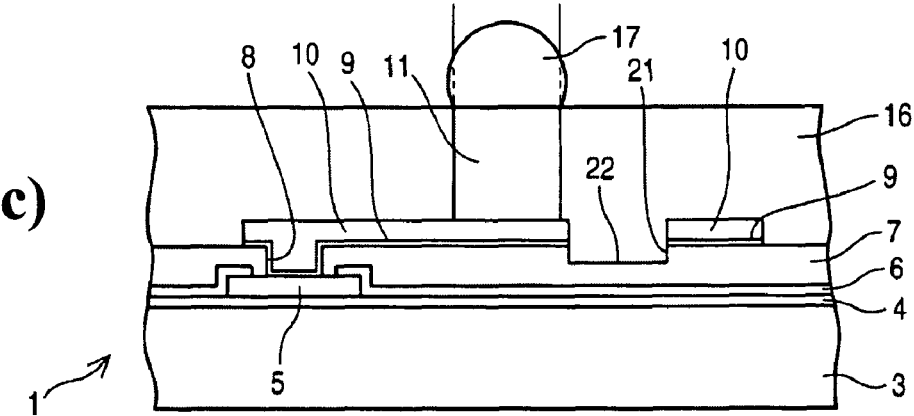

A second embodiment of the present invention will be explained next. FIGS. 3(a) to 3(e) are schematic views showing a process of producing a semiconductor device according to the second embodiment of the present invention. FIGS. 4(a) to 4(c) are schematic views showing the process of producing the semiconductor device according to the second embodiment of the present invention. Components in the second embodiment similar to those in the first embodiment are designated with the same reference numerals, and explanations thereof are omitted.

As shown in FIGS. 3(b) to 3(e) and 4(a) to 4(c), an inter-wiring groove 21 is formed in the insulating film 7 between the re-distribution wiring patterns 10 arranged next to each other. The inter-wiring groove 21 has a width same as a distance between the re-distribution wiring patterns 10. In forming the inter-wiring groove 21, the insulating film 7 with photosensitivity is exposed and developed.

In the embodiment, the inter-wiring groove 21 has a bottom surface 22, and a depth to the bottom surface 22 may reach the surface protection film 6. It is preferred that the depth does not reach the surface protection film 6, i.e., smaller than the film thickness of the insulating film 7. In the embodiment, the depth of the inter-wiring groove 21 is smaller than that of the through hole 8. Accordingly, it is possible to form the insulating film 7 with a normal exposure time in the exposure process. As a result, a period of time necessary for forming the insulating film 7 is prolonged only by a period of time necessary for exchanging the photo mask.

A method of producing the semiconductor device will be explained next with reference to FIGS. 3(a) to 3(e) and 4(a) to 4(c). A step shown in FIG. 3(a) is substantially same as that shown in FIG. 1(a), and explanation thereof is omitted.

In the next step, as shown in FIG. 3(b), similar to the step shown in FIG. 1(b) in the first embodiment, an insulating resin material is coated on the surface protection film 6 and the electrode pad 5 thus exposed. With the photo mask blocking the forming area of the through hole 8 on the electrode pad 5, the insulating resin material is exposed, so that the insulating resin material in a surrounding area of the forming area of the through hole 8 is cured up to the depth of the inter-wiring groove 21 down to the bottom surface 22.

In the next step, the photo mask is exchanged to another photo mask covering the forming area of the through hole 8 and a forming area of the inter-wiring groove 21 between the forming areas of the re-distribution wiring patterns 10. With the photo mask, the insulating resin material is cured up to the specific thickness of the insulating film 7. Afterward, the insulating resin material in an unexposed area is removed through the developing process, and the insulating resin material is cured through the thermal process to form the through hole 8 penetrating through the insulating film 7 to the electrode pad 5 and the inter-wiring groove 21 having the depth down to the bottom surface 22. In this step, instead of exchanging the photo masks, a photo mask covering only the forming area of the inter-wiring groove 21 may be overlapped.

Further, in this step, when the insulating resin material with positive-type photosensitivity is used, the photo mask blocks an area except the forming area of the through hole 8 and the forming area of the inter-wiring groove 21. The insulating resin material is exposed, so that the insulating resin material is softened down to the bottom surface 22 of the inter-wiring groove 21. Then, the photo mask is changed to another photo mask covering an area except the forming area of the through hole 8, and the insulating resin material in the forming area of the through hole 8 is softened. The insulating resin material in the exposed area is removed through the developing process, and the insulating resin material is cured through the thermal process to form the through hole 8 and the inter-wiring groove 21. Through the exposing process of the insulating film 7 in the two steps, it is possible to form the inter-wiring groove 21 having a width same as the distance between the re-distribution wiring patterns 10 arranged next to with each other.

In the next step, as shown in FIG. 3(c), similar to the step shown in FIG. 1(c) in the first embodiment, with the sputtering method, the base metal layer 9 is formed for covering the insulating film 7, an inner surface of the through hole 8, the electrode pad 5 exposed at the bottom of the through hole 8, and an inner surface of the inter-wiring groove 21.

In the next step, as shown in FIG. 3(d), similar to the step shown in FIG. 1(d) in the first embodiment, the resist mask 19 is formed over the area except the forming areas of the re-distribution wiring patterns 10, and the re-distribution wiring patterns 10 are formed with the electro plating method.

In the next step, as shown in FIG. 3(e), the resist mask 19 formed in the step shown in FIG. 3(d) is removed, and the resist mask 19 is formed one more time with the photolithography on the re-distribution wiring patterns 10 in the area except the electrode forming area 12.

In the next step, as shown in FIG. 4(a), the post electrode 11 is formed with the electro plating method using the copper sulfate plating solution and the resist mask 19 formed in FIG. 3(e) as the mask. In the electro plating method, a voltage of 0.5 V is applied to the exposed area of the re-distribution wiring patterns 10 for two hours between the plating electrode and the base metal layer 9 as the common negative electrode, and then copper is deposited to form the post electrode 11. Afterward, the resist mask 19 is removed using the removable solvent.

In the next step, as shown in FIG. 4(b), similar to the step shown in FIG. 2(b) in the first embodiment, the base metal layer 9 is removed in the area including the inner surface of the inter-wiring groove 21 except the re-distribution wiring patterns 10 and the post electrode 11.

In the next step, as shown in FIG. 4(c), similar to the step shown in FIG. 2(c) in the first embodiment, the sealing layer 16 is formed for covering the insulating film 7, the base metal layer 9, the re-distribution wiring patterns 10, the inter-wiring groove 21, and the post electrode 11, so that the post end surface of the post electrode 11 is exposed from the front surface of the sealing layer 16. Then, the bump electrode 17 is formed on the post end surface thus exposed. With the method described above, the semiconductor wafer 1 having a plurality of semiconductor devices is formed. After forming the semiconductor wafer 1, the semiconductor wafer 1 is divided into individual pieces, thereby obtaining the semiconductor device.

As described above, in the semiconductor device in the embodiment, the inter-wiring groove 21 is formed adjacent to the re-distribution wiring patterns 10 in the insulating film 7 between the re-distribution wiring patterns 10. Accordingly, it is possible to increase a distance in a vertical direction along which a corrosion product substance created at a boundary between the insulating film 7 and the sealing layer 16 grows. As a result, when the semiconductor device is operated under a high temperature and high humidity condition, even if the re-distribution wiring patterns 10 are corroded due to moisture absorbed in the insulating film 7 or the sealing layer 16, it is possible to prevent a distance between the adjacent re-distribution wiring patterns from increasing rapidly. Accordingly, it is possible to suppress an electrical leak generated between the adjacent re-distribution wiring patterns, thereby improving moisture resistance life of the semiconductor device.

In particular, the effect described above is beneficial in a semiconductor device of the CSP type having a small size, in which the adjacent re-distribution wiring patterns are apart from each other by a small distance.

As described above, in the embodiment, the inter-wiring groove 21 is formed adjacent to the re-distribution wiring patterns 10 in the insulating film 7 between the re-distribution wiring patterns 10 electrically connected to the electrode pad 5 and extending on the insulating film 7 through the base metal layer 9. Accordingly, it is possible to increase a distance in a vertical direction along which a corrosion product substance created at a boundary between the insulating film 7 and the sealing layer 16 grows. As a result, even when the re-distribution wiring patterns 10 are corroded due to moisture absorbed in the insulating film 7 or the sealing layer 16, it is possible to suppress an electrical leak generated between the adjacent re-distribution wiring patterns, thereby improving moisture resistance life of the semiconductor device.

Third Embodiment

Figure 6A:
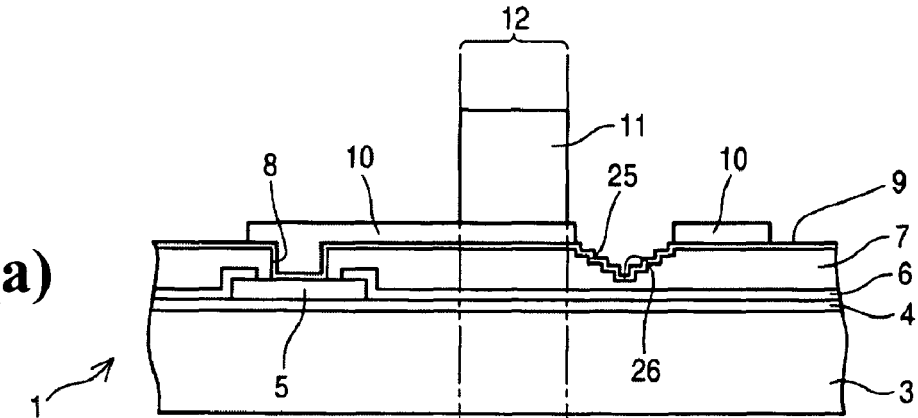
FIGS. 6(a) to 6(c) are schematic views showing the process of producing the semiconductor device according to the third embodiment of the present invention.
Figure 6B:
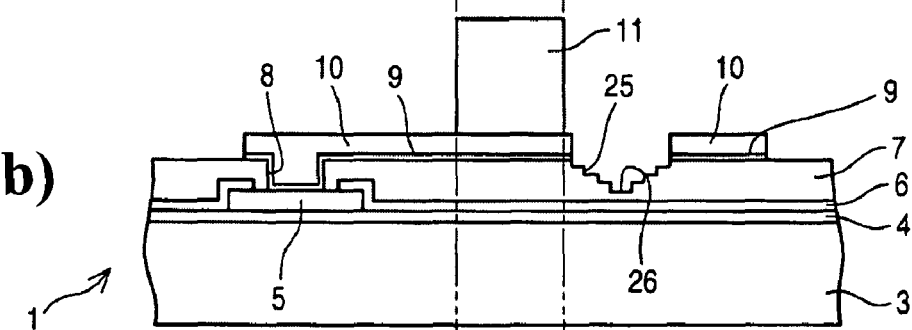
Figure 6C:
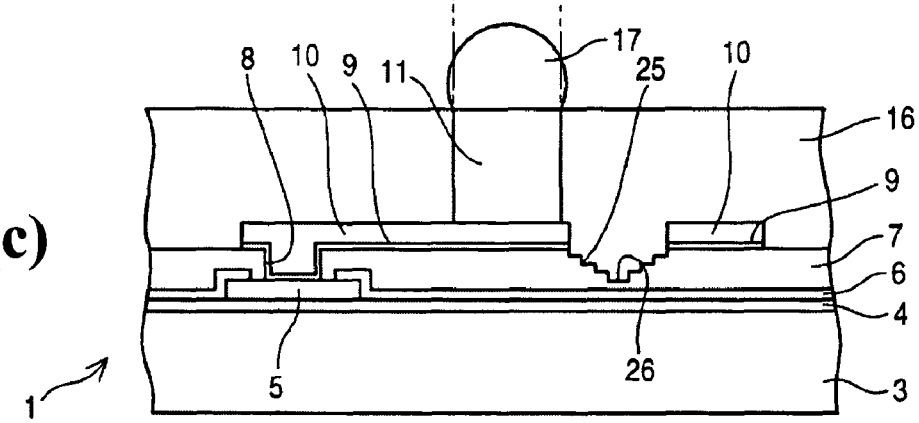

A third embodiment of the present invention will be explained next. FIGS. 5(a) to 5(e) are schematic views showing a process of producing a semiconductor device according to the second embodiment of the present invention. FIGS. 6(a) to 6(c) are schematic views showing the process of producing the semiconductor device according to the second embodiment of the present invention. Components in the third embodiment similar to those in the first and second embodiments are designated with the same reference numerals, and explanations thereof are omitted.

As shown in FIGS. 5(b) to 5(e) and 6(a) to 6(c), an inter-wiring step groove 25 is formed in the insulating film 7 between the re-distribution wiring patterns 10 arranged next to each other. The inter-wiring step groove 25 has a width same as a distance between the re-distribution wiring patterns 10. In forming the inter-wiring step groove 25, the insulating film 7 with photosensitivity is exposed and developed in several steps, so that the inter-wiring step groove 25 has a side surface with a step shape.

In the embodiment, the inter-wiring step groove 25 has a bottom surface 26, and a depth to the bottom surface 26 may reach the surface protection film 6. It is preferred that the depth does not reach the surface protection film 6, i.e., smaller than the film thickness of the insulating film 7. In the embodiment, the depth of the inter-wiring groove 21 is smaller than that of the through hole 8.

A method of producing the semiconductor device will be explained next with reference to FIGS. 5(a) to 5(e) and 6(a) to 6(c). A step shown in FIG. 5(a) is substantially same as that shown in FIG. 1(a), and explanation thereof is omitted.

In the next step, as shown in FIG. 5(b), similar to the step shown in FIG. 1(b) in the first embodiment, an insulating resin material is coated on the surface protection film 6 and the electrode pad 5 thus exposed. With the photo mask blocking the forming area of the through hole 8 on the electrode pad 5, the insulating resin material is exposed, so that the insulating resin material in a surrounding area of the forming area of the through hole 8 is cured up to the depth of the inter-wiring step groove 25 down to the bottom surface 26.

In the next step, the photo mask is exchanged to another photo mask covering the forming area of the through hole 8 and a forming area of the bottom surface 26 of the inter-wiring step groove 25 between the forming areas of the re-distribution wiring patterns 10. With the photo mask, the insulating resin material is cured up to a first step of the inter-wiring step groove 25 from the bottom surface 26. In the next step, the photo mask is exchanged to another photo mask covering the first step of the inter-wiring step groove 25 enlarged from the bottom surface 26 of the inter-wiring step groove 25. With the photo mask, the insulating resin material is cured up to a second step of the inter-wiring step groove 25 from the bottom surface 26. The steps described above are repeated to form each step of the inter-wiring step groove 25. At last, the photo mask is exchanged to another photo mask covering the forming area of the through hole 8 and a forming area of the inter-wiring step groove 25 between the forming areas of the re-distribution wiring patterns 10. With the photo mask, the insulating resin material is cured up to the specific thickness of the insulating film 7.

Afterward, the insulating resin material in an unexposed area is removed through the developing process, and the insulating resin material is cured through the thermal process to form the through hole 8 penetrating through the insulating film 7 to the electrode pad 5 and the inter-wiring step groove 25 having the depth down to the bottom surface 26. Through the more than three steps (five steps in the embodiment) of exposing the insulating film 7, it is possible to form the inter-wiring step groove 25 having the width same as the distance between the re-distribution wiring patterns 10 arranged next to each other and the side surface with a step shape.

In the next step, as shown in FIG. 5(c), similar to the step shown in FIG. 1(c) in the first embodiment, the base metal layer 9 is formed for covering the insulating film 7, the inner surface of the through hole 8, the electrode pad 5 exposed at the bottom of the through hole 8, and an inner surface of the inter-wiring step groove 25.

In the next step, as shown in FIG. 5(d), similar to the step shown in FIG. 1(d) in the first embodiment, the resist mask 19 is formed over the area except the forming areas of the re-distribution wiring patterns 10, and the re-distribution wiring patterns 10 are formed with the electro plating method.

In the next step, as shown in FIG. 5(e), the resist mask 19 formed in the step shown in FIG. 5(d) is removed with a removable solvent, and the resist mask 19 is formed one more time with the photolithography on the re-distribution wiring patterns 10 in the area except the electrode forming area 12.

In the next step, as shown in FIG. 6(a), similar to the step shown in FIG. 4(a) in the second embodiment, the post electrode 11 is formed on the re-distribution wiring pattern 10.

Afterward, the resist mask 19 formed in the step shown in FIG. 5(e) is removed using the removable solution.

In the next step, as shown in FIG. 6(b), similar to the step shown in FIG. 2(b) in the first embodiment, the base metal layer 9 is removed in the area including the inner surface of the inter-wiring step groove 25 except the re-distribution wiring patterns 10 and the post electrode 11.

In the next step, as shown in FIG. 6(c), similar to the step shown in FIG. 2(c) in the first embodiment, the sealing layer 16 is formed for covering the insulating film 7, the base metal layer 9, the re-distribution wiring patterns 10, the inter-wiring step groove 25, and the post electrode 11, so that the post end surface of the post electrode 11 is exposed from the front surface of the sealing layer 16. Then, the bump electrode 17 is formed on the post end surface thus exposed. With the method described above, the semiconductor wafer 1 having a plurality of semiconductor devices is formed. After forming the semiconductor wafer 1, the semiconductor wafer 1 is divided into individual pieces, thereby obtaining the semiconductor device.

As described above, in the semiconductor device in the embodiment, the inter-wiring step groove 25 is formed adjacent to the re-distribution wiring patterns 10 in the insulating film 7 between the re-distribution wiring patterns 10. Accordingly, similar to the second embodiment, it is possible to increase a distance in the step shape in a vertical direction along which a corrosion product substance created at a boundary between the insulating film 7 and the sealing layer 16 grows. As a result, when the semiconductor device is operated under a high temperature and high humidity condition, even if the re-distribution wiring patterns 10 is corroded due to moisture absorbed in the insulating film 7 or the sealing layer 16, it is possible to prevent a distance between the adjacent re-distribution wiring patterns from increasing rapidly. Accordingly, it is possible to suppress an electrical leak generated between the adjacent re-distribution wiring patterns, thereby improving moisture resistance life of the semiconductor device.

As described above, in the embodiment, the inter-wiring step groove 25 is formed adjacent to the re-distribution wiring patterns 10 in the insulating film 7 between the re-distribution wiring patterns 10. Accordingly, it is possible to obtain an effect similar to that in the second embodiment.

Fourth Embodiment

Figure 8A:
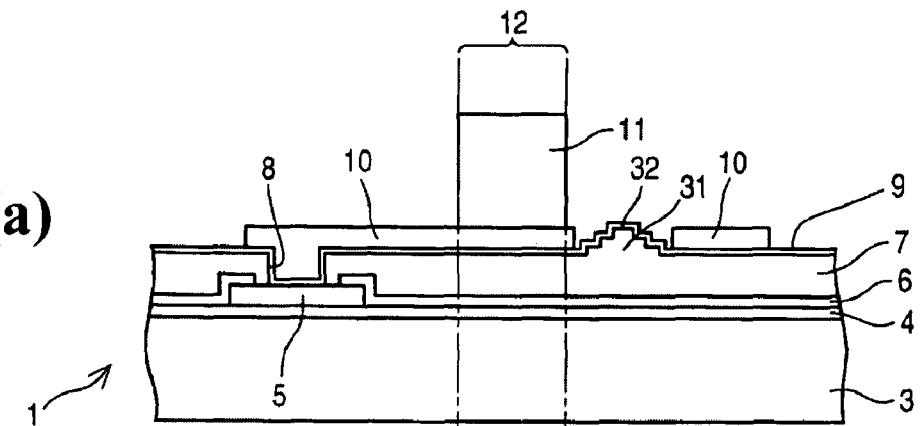
FIGS. 8(a) to 8(c) are schematic views showing the process of producing the semiconductor device according to the fourth embodiment of the present invention.
Figure 8B:
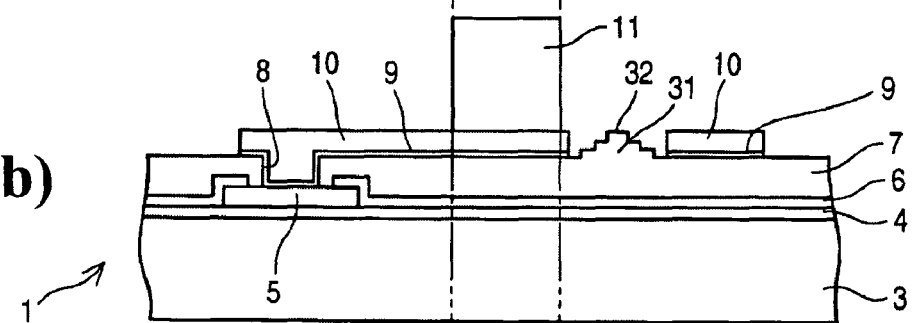
Figure 8C:
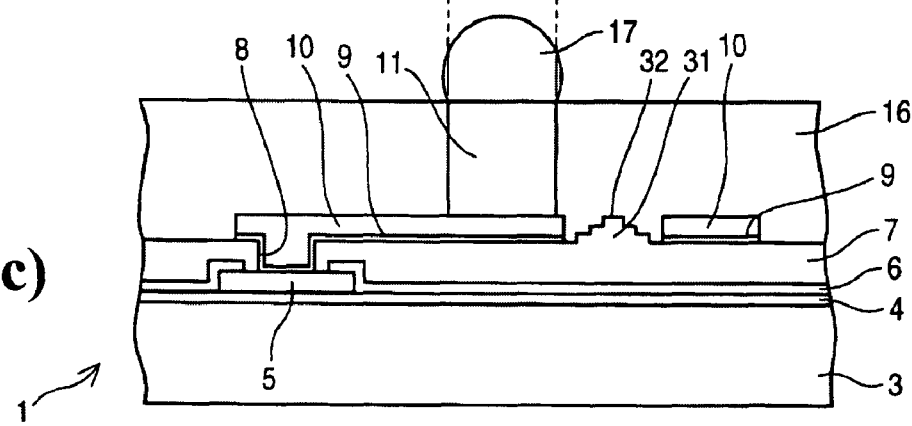

A fourth embodiment of the present invention will be explained next. FIGS. 7(a) to 7(e) are schematic views showing a process of producing a semiconductor device according to the second embodiment of the present invention. FIGS. 8(a) to 8(c) are schematic views showing the process of producing the semiconductor device according to the second embodiment of the present invention. Components in the fourth embodiment similar to those in the first to third embodiments are designated with the same reference numerals, and explanations thereof are omitted.

As shown in FIGS. 7(b) to 7(e) and 8(a) to 8(c), an inter-wiring step protrusion 31 is formed on the insulating film 7 between the re-distribution wiring patterns 10 arranged next to each other. In forming the inter-wiring step protrusion 31, the insulating film 7 with photosensitivity is exposed and developed in several steps, so that the inter-wiring step protrusion 31 has a step shape protruding from the insulating film 7.

In the embodiment, the insulating resin material for forming the insulating film 7 is coated with a thickness larger than that in the first and second embodiment. The inter-wiring step protrusion 31 has a top surface 31 at a height same as the film thickness of the insulating film 7 in the first embodiment.

A method of producing the semiconductor device will be explained next with reference to FIGS. 7(a) to 7(e) and 8(a) to 8(c). A step shown in FIG. 8(a) is substantially same as that shown in FIG. 1(a), and explanation thereof is omitted.

In the next step, as shown in FIG. 7(b), similar to the step shown in FIG. 1(b) in the first embodiment, an insulating resin material is coated on the surface protection film 6 and the electrode pad 5 thus exposed to have a thickness double of that in the first embodiment. With the photo mask blocking the forming area of the through hole 8 on the electrode pad 5, the insulating resin material is exposed, so that the insulating resin material in a surrounding area of the forming area of the through hole 8 is cured up to the specific thickness of the insulating film 7, i.e., same as that in the first embodiment.

In the next step, the photo mask is exchanged to another photo mask covering an area except a forming area of a first step of the inter-wiring step protrusion 31 between the forming areas of the re-distribution wiring patterns 10. With the photo mask, the insulating resin material is cured up to a height of the first step of the inter-wiring step protrusion 31. In the next step, the photo mask is exchanged to another photo mask covering an area except a forming area of a second step of the inter-wiring step protrusion 31 reduced from the first step of the inter-wiring step protrusion 31. With the photo mask, the insulating resin material is cured up to a height of the second step of the inter-wiring step protrusion 31. The steps described above are repeated to form each step of the inter-wiring step protrusion 31. At last, the photo mask is exchanged to another photo mask covering an area except a forming area of the top surface 32 of the inter-wiring step protrusion 31. With the photo mask, the insulating resin material is cured up to a height of the top surface 32 of the inter-wiring step protrusion 31.

Afterward, the insulating resin material in an unexposed area is removed through the developing process, and the insulating resin material is cured through the thermal process to form the through hole 8 penetrating through the insulating film 7 to the electrode pad 5, the insulating film 7 having a thickness same as that in the first embodiment, and the inter-wiring step protrusion 31 having the top surface 32. Through the several steps (four steps in the embodiment) of exposing the insulating film 7, it is possible to form the inter-wiring step protrusion 31 protruding in the step shape on the insulating film 7 between the re-distribution wiring patterns 10 arranged next to each other.

In the next step, as shown in FIG. 7(c), similar to the step shown in FIG. 1(c) in the first embodiment, the base metal layer 9 is formed for covering the insulating film 7, the inner surface of the through hole 8, the electrode pad 5 exposed at the bottom of the through hole 8, and an outer surface of the inter-wiring step protrusion 31.

In the next step, as shown in FIG. 7(d), similar to the step shown in FIG. 1(d) in the first embodiment, the resist mask 19 is formed over the area except the forming areas of the re-distribution wiring patterns 10, and the re-distribution wiring patterns 10 are formed with the electro plating method.

In the next step, as shown in FIG. 7(e), the resist mask 19 formed in the step shown in FIG. 7(d) is removed with a removable solvent, and the resist mask 19 is formed one more time with the photolithography on the re-distribution wiring patterns 10 in the area except the electrode forming area 12.

In the next step, as shown in FIG. 8(a), similar to the step shown in FIG. 4(a) in the second embodiment, the post electrode 11 is formed on the re-distribution wiring pattern 10.

Afterward, the resist mask 19 formed in the step shown in FIG. 7(e) is removed using the removable solution.

In the next step, as shown in FIG. 8(b), similar to the step shown in FIG. 2(b) in the first embodiment, the base metal layer 9 is removed in the area including the outer surface of the inter-wiring step protrusion 31 except the re-distribution wiring patterns 10 and the post electrode 11.

In the next step, as shown in FIG. 8(c), similar to the step shown in FIG. 2(c) in the first embodiment, the sealing layer 16 is formed for covering the insulating film 7, the base metal layer 9, the re-distribution wiring patterns 10, the inter-wiring step protrusion 31, and the post electrode 11, so that the post end surface of the post electrode 11 is exposed from the front surface of the sealing layer 16. Then, the bump electrode 17 is formed on the post end surface thus exposed. With the method described above, the semiconductor wafer 1 having a plurality of semiconductor devices is formed. After forming the semiconductor wafer 1, the semiconductor wafer 1 is divided into individual pieces, thereby obtaining the semiconductor device.

As described above, in the semiconductor device in the embodiment, the inter-wiring step protrusion 31 is formed adjacent to the re-distribution wiring patterns 10 on the insulating film 7 between the re-distribution wiring patterns 10. Accordingly, similar to the second embodiment, it is possible to increase a distance in the step shape in a vertical direction along which a corrosion product substance created at a boundary between the insulating film 7 and the sealing layer 16 grows. As a result, when the semiconductor device is operated under a high temperature and high humidity condition, even if the re-distribution wiring patterns 10 is corroded due to moisture absorbed in the insulating film 7 or the sealing layer 16, it is possible to prevent a distance between the adjacent re-distribution wiring patterns from increasing rapidly. Accordingly, it is possible to suppress an electrical leak generated between the adjacent re-distribution wiring patterns, thereby improving moisture resistance life of the semiconductor device.

Further, in the embodiment, the inter-wiring step protrusion 31 protrudes from the insulating film 7. Accordingly, it is possible to increase a strength of the insulating film 7 supporting the re-distribution wiring patterns 10 below the post electrode 11, thereby preventing the re-distribution wiring patterns 10 from breaking due to an external force applied to the post electrode 11, and improving reliability of the semiconductor device.

As described above, in the embodiment, the inter-wiring step protrusion 31 is formed adjacent to the re-distribution wiring patterns 10 on the insulating film 7 between the re-distribution wiring patterns 10. Accordingly, it is possible to obtain an effect similar to that in the second embodiment.

Further, the inter-wiring step protrusion 31 protruding from the insulating film 7 is formed on the insulating film 7 between the re-distribution wiring patterns 10. Accordingly, it is possible to increase a strength of the insulating film 7 supporting the re-distribution wiring patterns 10 below the post electrode 11, thereby preventing the re-distribution wiring patterns 10 from breaking due to an external force applied to the post electrode 11, and improving reliability of the semiconductor device.

The disclosure of Japanese Patent Application No. 2006-232233, filed on Aug. 29, 2006, is incorporated in the application.

While the invention has been explained with reference to the specific embodiments of the invention, the explanation is illustrative and the invention is limited only by the appended claims.

What is claimed is:

1. A semiconductor device, comprising:
a semiconductor substrate having an internal circuit;
an electrode pad electrically connected to the internal circuit;
an insulating film having a through hole exposing the electrode pad;
a re-distribution wiring pattern formed on the insulating film and electrically connected to the electrode pad;
a recess groove formed in the insulating film, said recess groove being situated outside the re-distribution wiring pattern and disposed adjacent to an edge of the re-distribution wiring pattern; and
a sealing layer filled in the recess groove and covering the re-distribution wiring pattern so that the sealing layer directly contacts with the recess groove.

2. The semiconductor device according to claim 1, wherein said recess groove has a depth smaller than a thickness of the insulating film.

3. The semiconductor device according to claim 1, wherein said recess groove is disposed in an area between the re-distribution wiring pattern and an adjacent re-distribution wiring pattern.

4. The semiconductor device according to claim 1, wherein said insulating film is formed of an insulating resin material with photosensitivity.

5. The semiconductor device according to claim 1, further comprising a metal base layer, said re-distribution wiring pattern being formed on the insulating film with the metal base layer inbetween.

6. The semiconductor device according to claim 1, further comprising a post electrode formed on the re-distribution wiring pattern.

* * * * *